(12) United States Patent
Lin et al.

(10) Patent No.: US 6,372,996 B2
(45) Date of Patent: Apr. 16, 2002

(54) CIRCUIT BOARD HAVING SHIELDING PLANES WITH VARIED VOID OPENING PATTERNS FOR CONTROLLING THE IMPEDANCE AND THE TRANSMISSION TIME

(75) Inventors: Gwun-Jin Lin; Chi-Kuang Hwang; Ching-Cheng Tien, all of Taoyuan (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 0 days.

(21) Appl. No.: 09/777,267

(22) Filed: Feb. 5, 2001

Related U.S. Application Data

(62) Division of application No. 09/144,005, filed on Aug. 31, 1998, now Pat. No. 6,225,568.

(51) Int. Cl.[7] .................................................. H05K 1/00
(52) U.S. Cl. .................................. 174/250; 174/117 FF
(58) Field of Search ............................ 174/35 C, 35 R, 174/117 FF, 250, 255, 261, 265, 268; 361/794, 800

(56) References Cited

U.S. PATENT DOCUMENTS

| | | | | |
|---|---|---|---|---|
| 5,334,800 A | * | 8/1994 | Kenny | 174/35 R |
| 5,912,809 A | * | 6/1999 | Stigerwald et al. | 361/780 |
| 5,929,375 A | * | 7/1999 | Giovatsky et al. | 174/35 R |
| 6,225,568 B1 | * | 5/2001 | Lin et al. | 174/250 |

* cited by examiner

*Primary Examiner*—Jeffrey Gaffin
*Assistant Examiner*—Jeremy Norris

(57) ABSTRACT

A flexible circuit board with specific shielding planes is used for low voltage differential transmission mode circuits. Both the impedance and the transmission time for the transmission line in the circuit board are controlled by shielding planes with varied void opening patterns. Capacitance and slow wave effects related to the combination of void opening patterns and the location configuration related to locations of void opening patterns are used to improve the impedance and transmission timing for the transmission line in the circuit board.

46 Claims, 19 Drawing Sheets

CIRCUIT BOARD HAVING SHIELDING PLANES WITH VARIED VOID OPENING PATTERNS FOR CONTROLLING THE IMPEDANCE AND THE TRANSMISSION TIME

CROSS-REFERENCES TO RELATED APPLICATIONS

This is a division of U.S. application Ser. No. 09/144,005, filed Aug. 31, 1998 now U.S. Pat. No. 6,225,568.

FIELD OF THE INVENTION

The present invention relates to a circuit board or a flexible cable (Flexible Printed Circuit Board (FPC), Flexible Flat Cable (FFC), etc.), and more specifically, to a circuit board or a flexible cable with shielding planes, which have varied void opening patterns used to control both the impedance and the transmission time.

BACKGROUND OF THE INVENTION

For high-speed logic circuits in digital computers, applications of microstrip and stripline structures are very often and extensively used to the interconnection between these circuits. Moreover, for the high-speed data transmission rate, the differential mode of transmission lines with shielding planes is a necessary and important method for low voltage (3.3 Voltage) to reduce transmission errors induced by the noise during the data transmission. There is a requirement of one hundred ohm impedance for differential mode of transmission lines. Recently, automatic techniques and equipment are capable of fabricating these structures with the controllable impedance and transmitted timing of signal paths. However, the asymmetric structure of microstrips has a serious disadvantage because of the weakness of the mechanical properties for flexible cables, and it also permits significant levels of extraneous electromagnetic radiation.

For the symmetric structure of striplines, not only can it enhance the mechanical features of flexibility and anti-fatigue for flat flexible cables, but also greatly reduce effects of electromagnetic radiation. However, due to the symmetric structure of striplines, the additional ground reference plane greatly reduces the impedance of signal path because of the increasing capacitance between the signal path and the additional ground reference plane. To consider the high flexibility and anti-fatigue with repeated motion for the stripline type of flat flexible cables, the distance between the differential mode of signal paths and the ground reference plane should be designed to be shorter than that between the pair of the differential mode of signal paths. It also implies that the same design method is needed for avoiding increasing the thickness of the printed circuit board to maintain the desired impedance at the same time.

Ground planes or other voltage reference planes are positioned in planes parallel to the conductor planes in which the conductors are designed in plane in a flexible cable or a printed circuit board. It aims to control the impedance of the conductors and to block the transmission of electromagnetic radiation from conductors carrying high frequency signals. A solid ground plane is generally used in printed circuit boards or flexible cables, but it is inflexible except for the thin film type.

Another disadvantage for solid ground plane is that the impedance of signal lines may be lower than desired because the large capacitance is built up in the small spacing between the signal lines and a solid ground plane or the reference plane. The more we increase the spacing between the signal lines and a solid ground plane or the reference plane to reduce the capacitance and thereby increase the impedance of the signal lines, the thicker and thus less flexible and more likely to break with repeated motion. Similarly, a printed circuit board becomes thicker and thus more heavy and more costly to build.

Reference planes having conductive elements formed in a grid have been utilized in microstrip designs to increase the impedance and to provide flexibility. However, because the grid is not continuous like a solid reference plane, it has been found to be quite difficult to control both impedance and transmitted timing of signal lines protected by a grid reference plane with only one pattern.

One of the particular difficulties is to control the impedance of flexible cables and printed circuit boards utilizing grid reference planes, especially for stripline type cables with the structure of turns. Generally, when the orientation of a signal line needs to be changed by, for example, 90 degrees or the like, the turn is not incorporated into the signal line with a single 90-degree turn. Rather, the change in orientation is generally implemented with a curve such that the orientation of the signal line varies continuously from its original orientation to the new orientation. It is likely that the signal line will have different alignment with the conduction of the upper or the lower grid with both grids at various points in the turn. Such alignment causes a significant variation in impedance at such points and causes a substantial impedance discontinuity.

The impedance of microstrip and stripline construction is determined by the signal conductor width, the separation of the conductor from the reference planes, the dielectrics that surround the conductor and, to a lesser degree, the thickness of the conductor. However, such traditional methods of determining impedance in striplines and microstrips impose too many constraints on the designer. For example, the impedance needs to be twice of 100 ohms for the differential mode transmission lines. One way of obtaining such high impedance using existing technology is to increase the separation between the signal conductor and the reference plane. However, this would require the use of a thicker flexible cable with the less flexibility and anti-fatigue, different dielectric constant materials surrounding the conductor, or expensive printed circuit boards of nonstandard thickness. Such nonstandard printed circuit boards are not only expensive to implement, but also undesirable in many applications due to their thickness.

There is a disadvantage associated with traditional microstrip construction with high-speed transmission rate in that it generates both forward and reverse crosstalk, which can seriously deteriorate signal quality. Crosstalk is the effect of coupling the signal of one channel into another. Crosstalk may arise from a number of sources, one of which is the unbalance of cable parameters, in particular, the capacitance and inductance between conductors. Therefore, this unbalance may result in a serious coupling from the signal of one conductor into another, and such unbalance is generally aggravated when a conductor is exposed to non-homogeneous media, as is the case with traditional microstrip construction.

Solid surface conductors in traditional microstrip construction are most likely to radiate high levels of electromagnetic radiation to interfere with the functioning of surrounding electronics. Conversely, extraneous radiation may also affect the operation of surface conductors. In traditional microstrip construction with high-speed transmission rate, the surface of the conductor is free to radiate into the cavity of the system enclosing the circuit board, so it is difficult to provide adequate shielding. It implies that the structure of stripline is needed to reduce the containment of such radiation. However, desired high impedance conductors of stripline construction is very difficult to implement without drastically increasing the separation between reference planes and conductors. Such an undesired increase in thickness would cause problems for the case of thin circuit boards needed in notebook computers or other standard circuit board needed to reduce the cost.

Flexible reference planes are needed for a stripline type flexible cable to have the capability of thousands of flexures, to achieve desired impedance and transmitted timing that permit transfer of the signals without degrading the signal quality, and to provide an acceptable shielding capability.

Due to the slow wave effect, the transmitted time on the solid plane is faster than that of the shielding with void opening patterns. When the difference among the length of the transmission line is large enough to have timing effect for high-speed transmission rate, the traditional method is to add extra equivalent length for the short transmission lines at some place to compensate for this effect. But this traditional extra length compensation may induce an undesired electromagnetic radiation due to the discontinuity of the impedance.

Even though the transmission lines have the same length, sometimes, it is necessary to control the transmitted timing to avoid the significant harmonic mode of the high-speed transmission rate. The transmitted time is related to the dielectric constant of the surrounding material, the slow wave effect due to the shielding pattern, and the compatible long length of transmission line. If it equals the significant harmonic mode of the high speed of transmission rate, the harmonic mode of this signal will bounce back and forth between two ends of the transmission line to deteriorate the signal transmission.

SUMMARY OF THE INVENTION

The present invention is related to a flexible cable (Flexible Printed Circuit Board (FPC), Flexible Flat Cable (FFC), etc.) and a printed circuit board with shielding planes for transmission lines (preferably, low voltage differential transmission mode circuits). According to the present invention, both the impedance and transmission time for the transmission line in the cable can be controlled by shielding planes with varied void opening patterns. Capacitance and slow wave effects related to the combination of void opening patterns and the location configuration related to locations of void opening patterns are the major factors to consider.

Two major categories of varied void opening patterns are used. The first one is to design the shielding planes with a set of varied void opening patterns, and the second one is a combination of a set of varied void opening patterns (preferably, a fixed void opening pattern) and a set of small predetermined configuration of solid patterns.

It is also intended to design the transmission time and impedance with the consideration of the mechanical flexibility of the flexible cable or the thickness of the printed circuit board.

Varied void patterns are applied on the shielding plane to generate slow wave effect and to reduce the capacitance of the transmission lines which can control the transmission time and increase the impedance at the same time for matching the requirements.

Thin film type conductive elements such as silver paste on shielding planes are connected and designated as the only ground paths for the transmission lines. Suitable resistance type impedance is provided to reduce the undesired harmonic mode effect which bounces back and forth between two ends of the transmission line. At least one ground path (preferably one) for the DC power is added to reduce the power consumption of silver paste. During the turn of the cable, the crosstalk between the transmission lines is blocked by use of via located at suitable position with suitable spacing.

Therefore, the object of the present invention is to provide a printed circuit board or a flexible cable that comprises a first shielding plane with a predetermined shielding configuration, which consists of conductive elements with a first set of predetermined varied void opening patterns and a first predetermined location configuration. The predetermined location configuration is related to locations of varied void opening patterns. There are two predetermined location configurations: the first one is not related to curves of the signal lines, and the second one is related to curves of the signal lines. The printed circuit board or the flexible cable further comprises a second shielding plane with a second predetermined shielding configuration, which consists of conductive elements with a second set of predetermined varied void opening patterns and a second predetermined location configuration.

Another object of this invention is to provide a method for simplifying the design of the impedance and transmission time with the same first and second location configurations. The method may have the same set of varied void opening patterns and the same location configuration, but the first shielding plane is the mirror image of the second shielding plane. The identical shielding plane is used for further simplifying the design of the impedance and transmission time. A conducting element is positioned between the first and the second shielding planes to form the signal conductor.

Another aspect of the present invention is to provide a printed circuit board or a flexible cable that comprises a first shielding plane with a predetermined shielding configuration, which comprises conductive elements with the combination of a fixed void opening pattern (or a set of varied void opening patterns) and a small predetermined portion of solid pattern. The printed circuit board or the flexible cable further comprises a second shielding plane having a second predetermined configuration. A conducting element is positioned between the first and the second shielding to form the signal conductor.

Another aspect of the present invention is a method to select varied void opening patterns, which induce slow wave effects to compensate for this timing effect with the less undesired electromagnetic radiation.

Another aspect of the present invention is a method to select the preferable locations and preferable orientation for the small portion of solid shielding.

Another object of this invention is to provide a printed circuit board or a flexible cable with the microstrip structure that comprises a shielding plane with a predetermined shielding configuration, which consists of conductive elements with a set of predetermined varied void opening patterns and a predetermined location configuration.

Other object of this invention is to provide a printed circuit board or a flexible cable with the microstrip structure with a shielding plane. The shielding plane has a predetermined shielding configuration comprising conductive elements with the combination of a fixed void opening pattern (or a set of varied void opening patterns) and a small predetermined portion of solid pattern.

Other features and advantages of the present invention will become apparent from the following description which refers to the accompanying drawings.

DETAILED DESCRIPTION OF THE PREFERRED EMBODIMENTS

Figure 1:
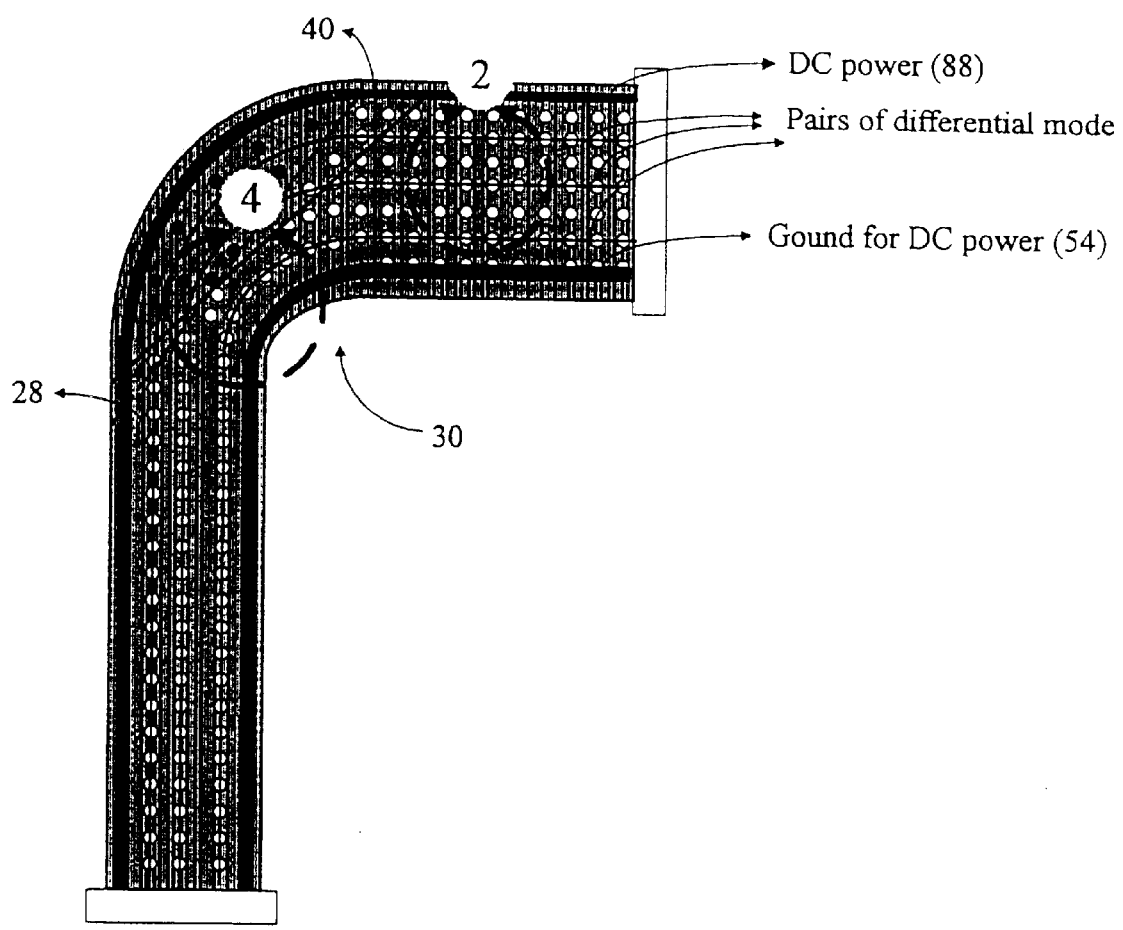
FIG. 1 depicts a plan view of a shielded circuit board as the first embodiment in accordance with the present invention.

With reference to FIG. 1, a plane view of a shielded circuit board 30 as the first embodiment in accordance with the present invention is illustrated.

The circuit board 30 may electrically connect the base and the movable display screen of a notebook computer for low voltage (3.3 Voltage) differential mode with high-speed transmission rate (455 MHz) and high impedance (100 ohms). The circuit board 30 with a turn has effect of varied transmission timing, and the circuit board with compatible length (around 32 cm) has effect with the second mode of harmonics (910 MHz) of the transmission frequency 455 MHz. The impedance is designed around 100 ohms. Time Domain Reflector (TDR) is used to measure the transmitted timing with different varied opening patterns, and the measured transmission time is in the range between 1.8 nsec (for solid reference pattern) and 2.5 nsec (for grid pattern), that is, the transmission time is between 0.9 nsec and 1.25 nsec.

Therefore, the goal of the present invention is to control both the impedance and the transmitted timing at the same time by using shielding plane with varied void opening patterns. And varied void opening patterns can be categorized as the following two major categories: the first one is to design the shielding planes with a first set of predetermined varied void opening patterns, and the second one is a combination of a set of predetermined fixed void opening patterns (preferably one) and predetermined small portion of solid patterns. These configurations of void opening patterns have not only controllable impedance but also varied slow wave effects to compensate for varied timing effect with less undesired electromagnetic radiation.

The circuit board 30 is classified as the second category, so the predetermined small portion of solid shielding, as shown in a section denoted by 4 of FIG. 1, is the area of the conductive element without any void opening pattern. It comprises only solid pattern. The preferable locations of the solid patterns are at the turn of the circuit board 30, both ends of the cable, and the place of the cable needed to be folded because discontinuity of the impedance at these locations normally can not be avoided. The preferable void opening pattern is symmetric such as circle, square, ellipse, and rhombus. The most preferable one is circle because it is symmetric in any direction.

Figure 2:
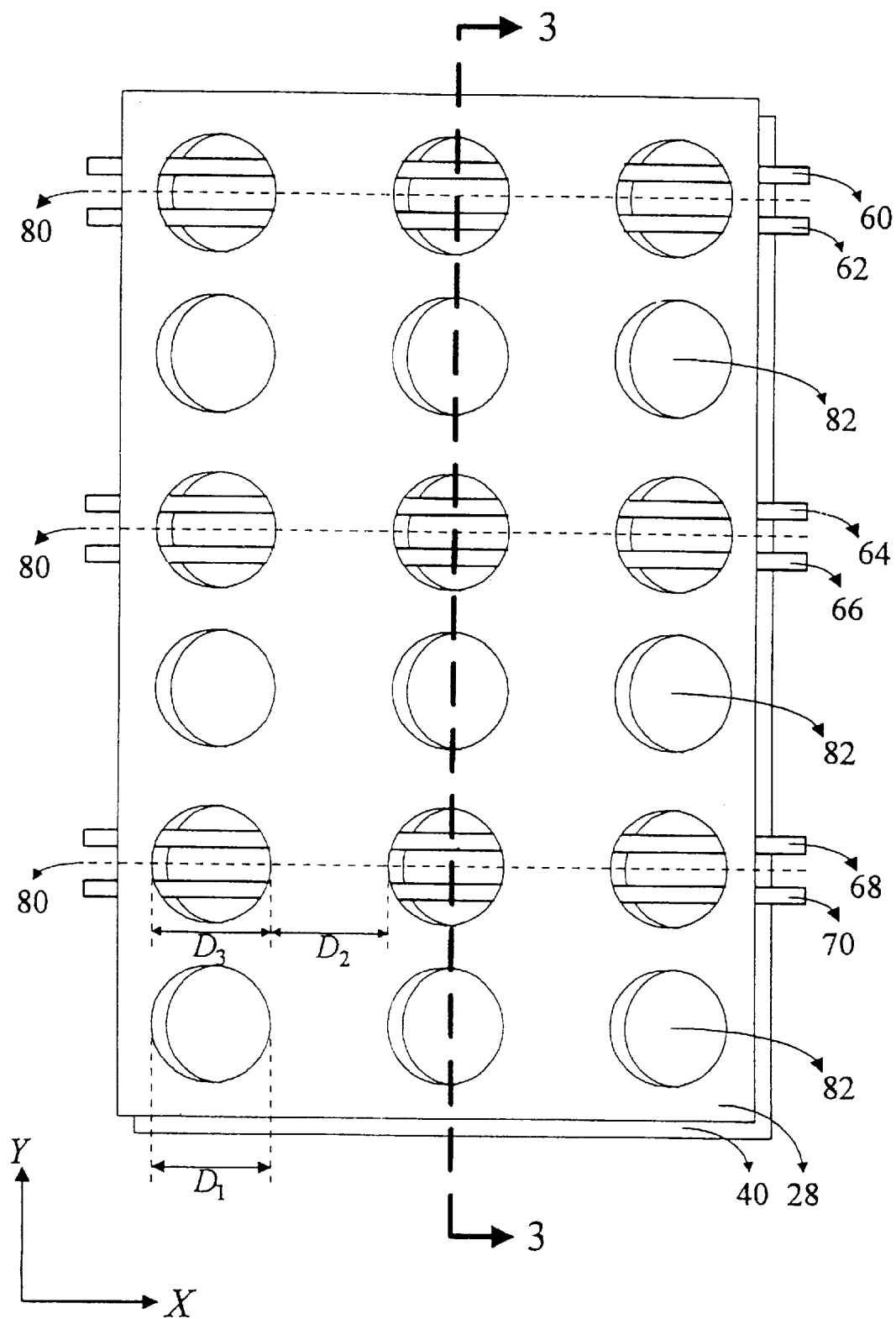
FIG. 2 depicts an enlarged view of a section denoted by 2 in FIG. 1.

Another aspect of the present invention uses the shielding planes 28, 40 as the only ground for the differential mode of transmission lines 60, 62, 64, 66, 68, 70 as shown in FIGS. 1 and 2. That is, in the middle layer of the cable there is no ground conductor all the way between both ends of the cable. This can greatly reduce the extra need of via for the ground conductors positioned all the way in the middle layer and between two ends of the cable. Therefore, further aspect of the present invention is a method to design better mechanical features of repeating flexing and to prevent electromagnetic radiation as we compared with the traditional method. A further aspect of the present invention by using the shielding planes 28, 40 as the only ground for the differential mode of transmission lines 60, 62, 64, 66, 68, 70 is to have better slow wave effects to control the transmitted timing. The usage of thin film type conductive elements can also offer suitable resistance type impedance to reduce the undesired harmonic mode effect which bounces back and forth between two ends of the transmitted line 60, 62, 64, 66, 68, 70.

Most of the time, the DC power 88, as shown in FIG. 1, is from one end of the circuit board 30 to the other, and the position of it is most likely in the middle layer of the flexible circuit board 30. The thin film type conductive element (i.e. silver paste) is designated as the only ground for the high-speed of differential mode of transmission lines 60, 62, 64, 66, 68, 70. Therefore, there is one path all the way in the middle of the flexible circuit board 30 as the ground 54 for the DC power 88 parallel to the differential mode of transmissions lines 60, 62, 64, 66, 68, 70, as shown in FIGS. 1 and 2. This ground 54 is designed only for the DC power 88 and it is not for the high-speed transmission lines 60, 62, 64, 66, 68, 70. So the preferable location is as far as possible away from the transmission lines 60, 62, 64, 66, 68, 70 as shown in FIGS. 1 and 2.

The circuit board 30 of the present invention comprises as illustrated in FIG. 2: an upper shielding plane 28 comprising a conductive element with predetermined configuration of a circular void opening pattern 82; a lower shielding plane 40 comprising a similar conductive element with predetermined configuration of the same void opening; and differential mode of signal conductors 60, 62, 64, 66, 68, 70, wherein all the virtual ground 80 of these pairs are aligned in line with respect to the center of the void opening patterns 82. The preferred conductive element in both of the shielding planes 28, 40 is thin film type conductive elements, such as sliver past, with mechanical features of repeated flexing and anti-fatigue, and it is easy to implement a complicated shielding pattern required by the present invention if printed silver paste is used.

The upper shielding plane 28 is in alignment with the lower shield plane with respect to the center of the void opening patterns 82 with preferable no offset. D2 is the spacing along the virtual ground 80 of differential mode of signal conductors 68, 70 between two void openings on the upper plane 28. Conversely, D3 is the length of a void opening on the upper plane 28 along the virtual ground 80. After we test many locations of the virtual ground 80, the applicable locations are where the pair of differential mode signal conductors 68, 70 can be located both inside the circular void opening pattern to have slow wave effects. It depends on the curve of the signal conductor, and the length of D1 and D2 as shown in FIG. 2. The preferred configuration of circle type void opening patterns is to have D2=D3 for the cable without changing the orientation. For the circuit board 30, the virtual ground 80 located at the left of the center of circle is best to have equal timing for signal conductors 68, 70 because of an increasing solid spacing D2 for the signal conductor 68 and a decreasing spacing D2 for the signal conductor 70. Capacitance effect related to the void opening pattern in the shield planes 28, 40 and the slow wave effect can be taken into account to design the impedance and the transmitted time from one end of the flexible cable to the other end of the cable, respectively, at the same time.

If the distance D1 is designated the largest dimension of the openings in both of the shielding planes 20, 40, then in order to have effective barrier to the emission of electromagnetic radiation, the distance D1 is preferably designed to be less than 1/20 of the size of the smallest expected wavelength of the signal traveling through the signal conductors 60, 62, 64, 66, 68, 70. Therefore, both of the shielding planes 28, 40 are effective shielding planes.

Figure 3:
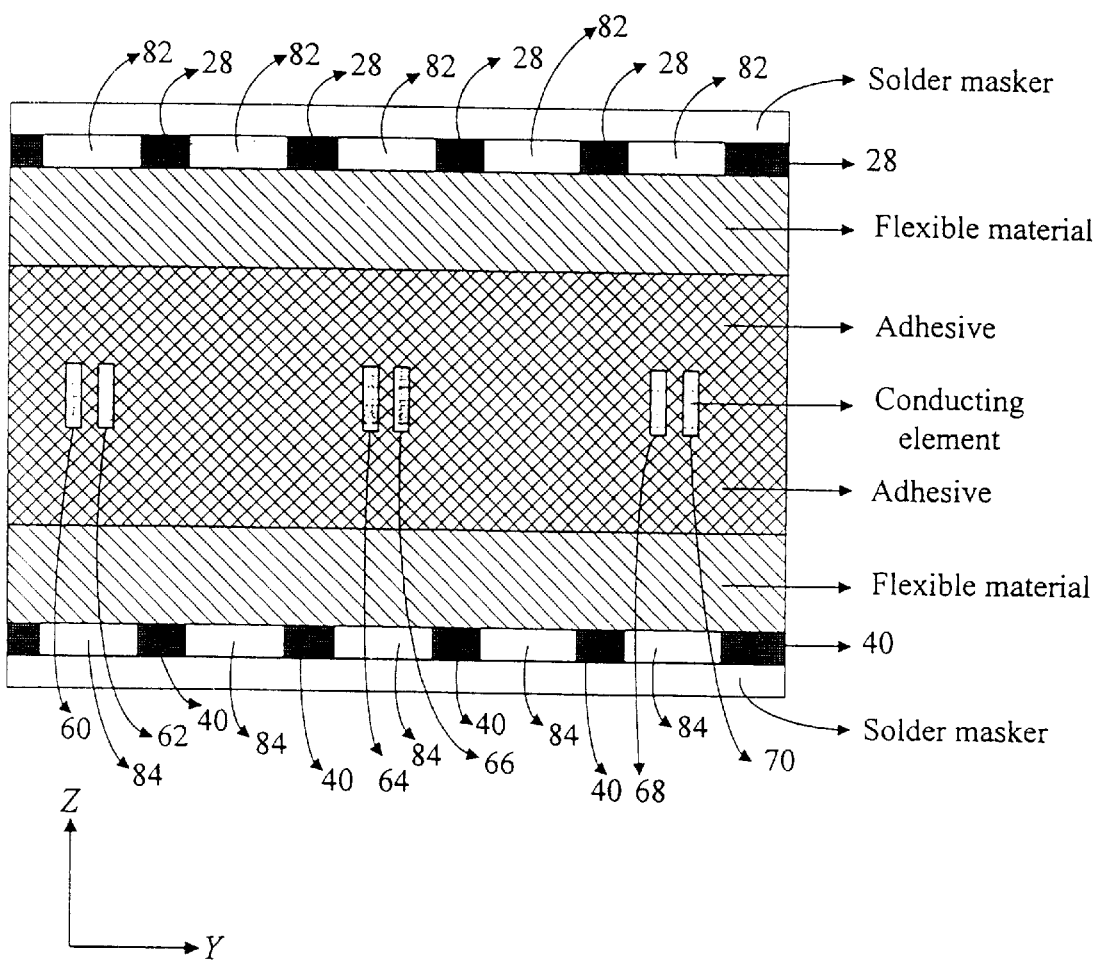
FIG. 3 depicts a cross-sectional elevational view of the present invention taken along the line 3—3 in FIG. 2.

In order to more fully understand the following description, it is helpful to establish an X, Y, and Z coordinate system for the drawing FIGS. 2–5. The X and Y axes lie in a horizontal plane as shown in FIG. 2. Both of the upper and lower shielding planes are parallel to the horizontal plane. Similarly, the differential mode of transmission conductors 60, 62, 64, 66, 68, 70 are in a plane which is between and parallel to the upper and lower planes 20, 40. The principal orientations of the differential mode of transmission conductors 60, 62, 64, 66, 68, 70 are parallel to the Y axis, as illustrated in FIG. 2, or parallel to the X axis when a 90 degree turn is needed, as shown in FIG. 1. The Z axis is perpendicular to both of the X and Y axes, as shown in FIG. 3.

Figure 6:
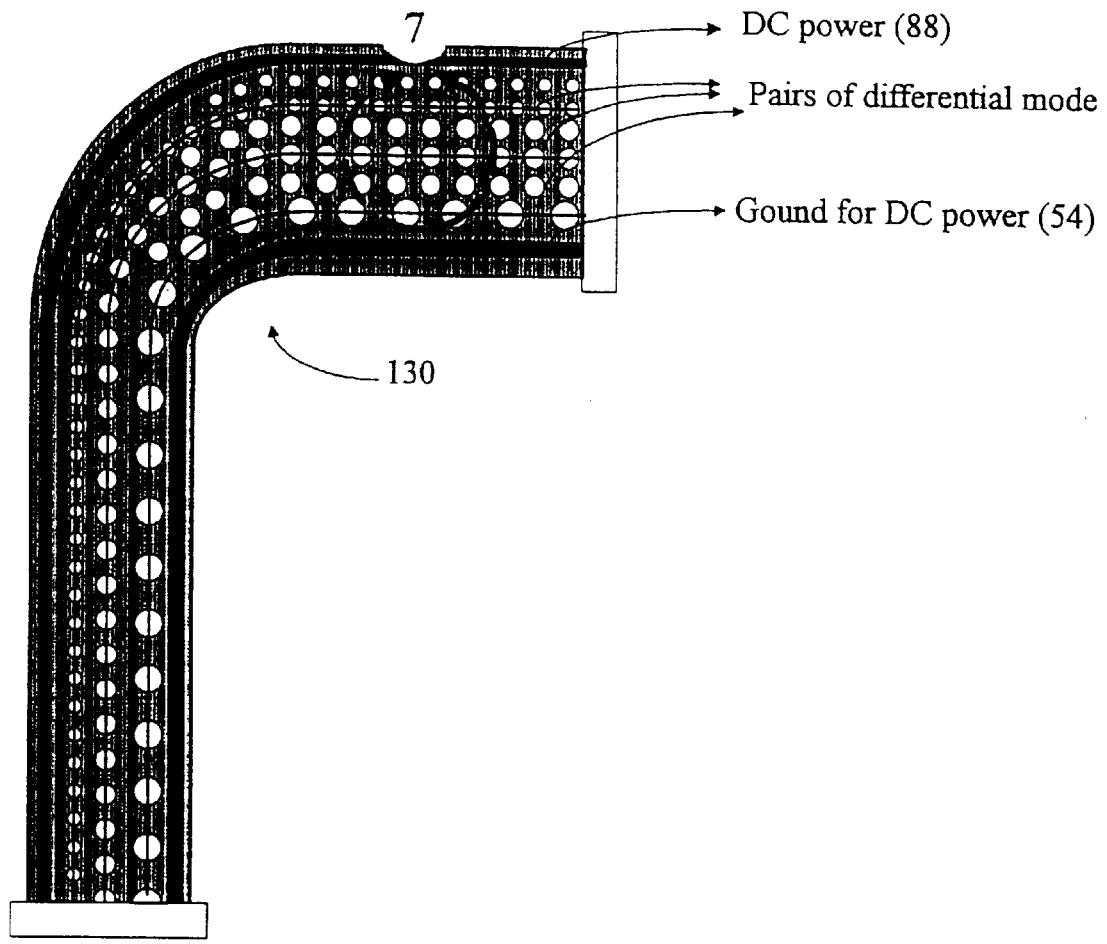
FIG. 6 depicts a plan view of a shielded circuit board as the second embodiment in accordance with the present invention.
Figure 9:
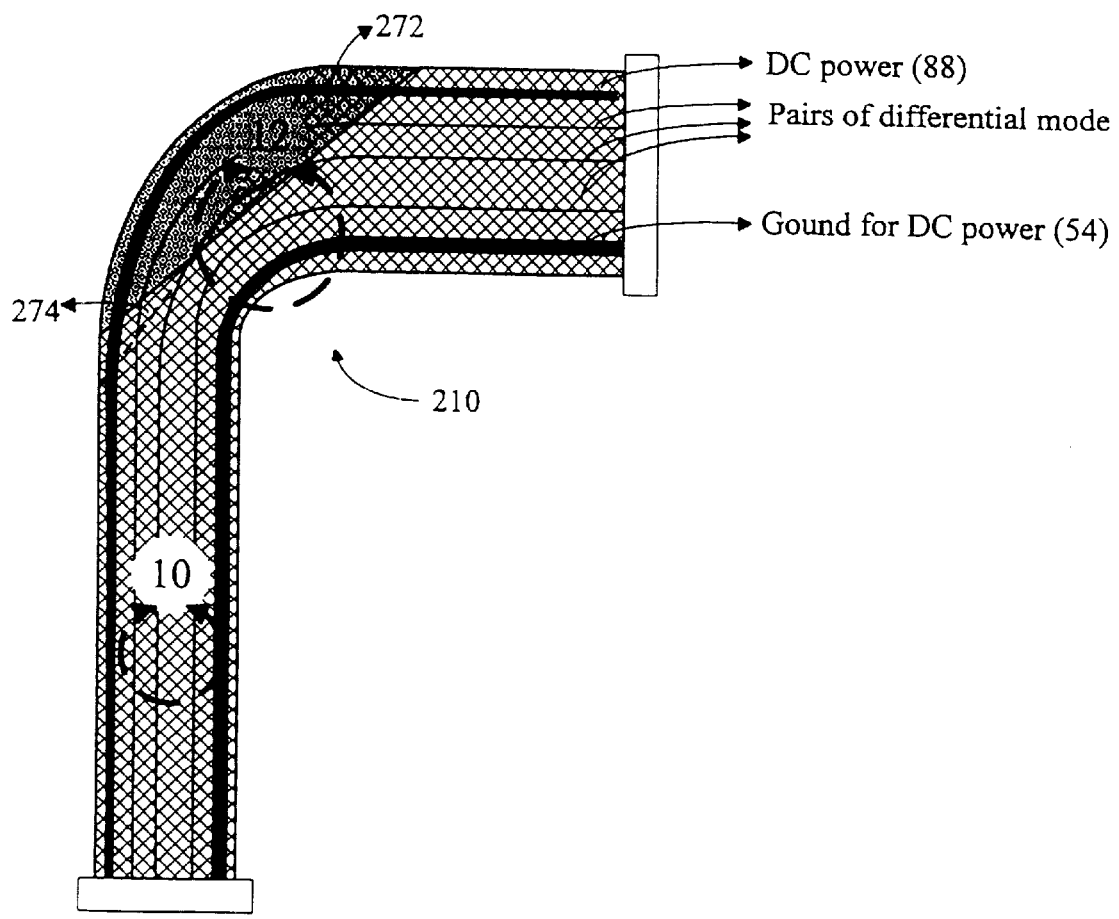
FIG. 9 depicts a plan view of a shielded circuit board as the third embodiment in accordance with the present invention.
Figure 14:
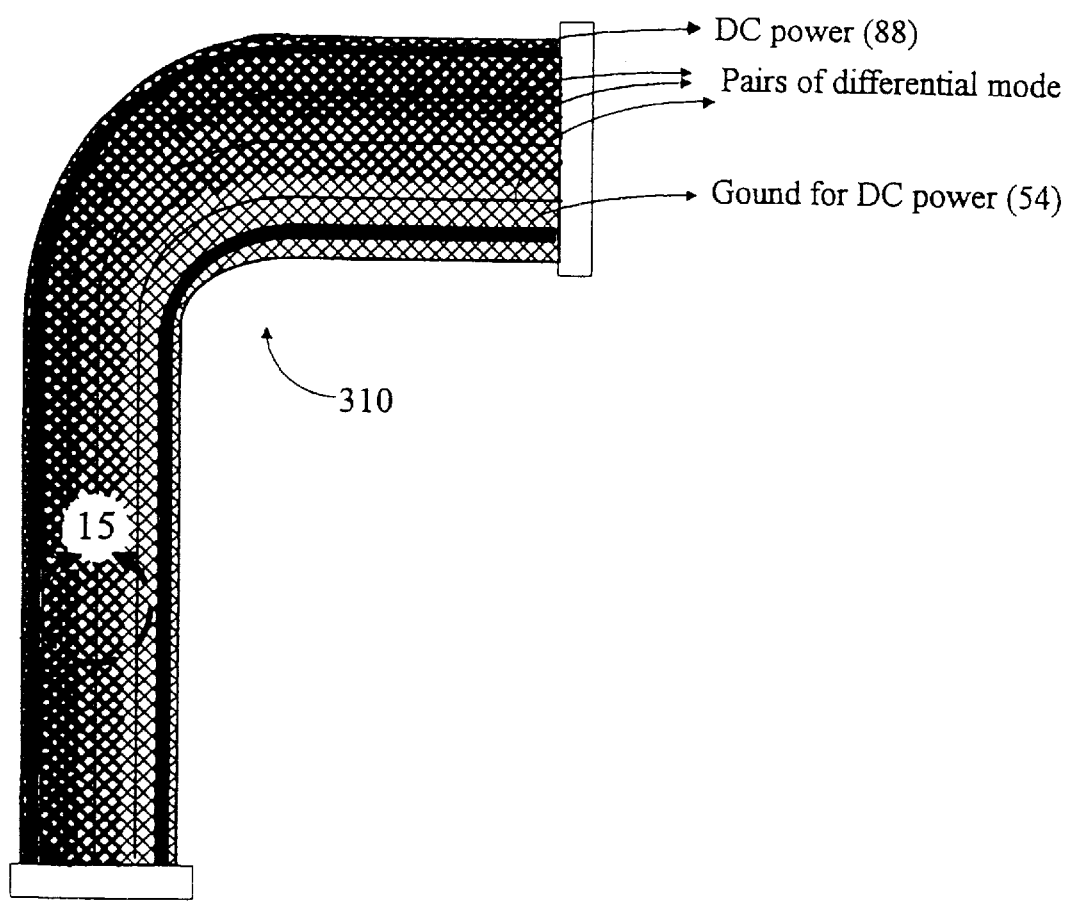
FIG. 14 depicts a plan view of a shielded circuit board as the fourth embodiment in accordance with the present invention.
Figure 17:
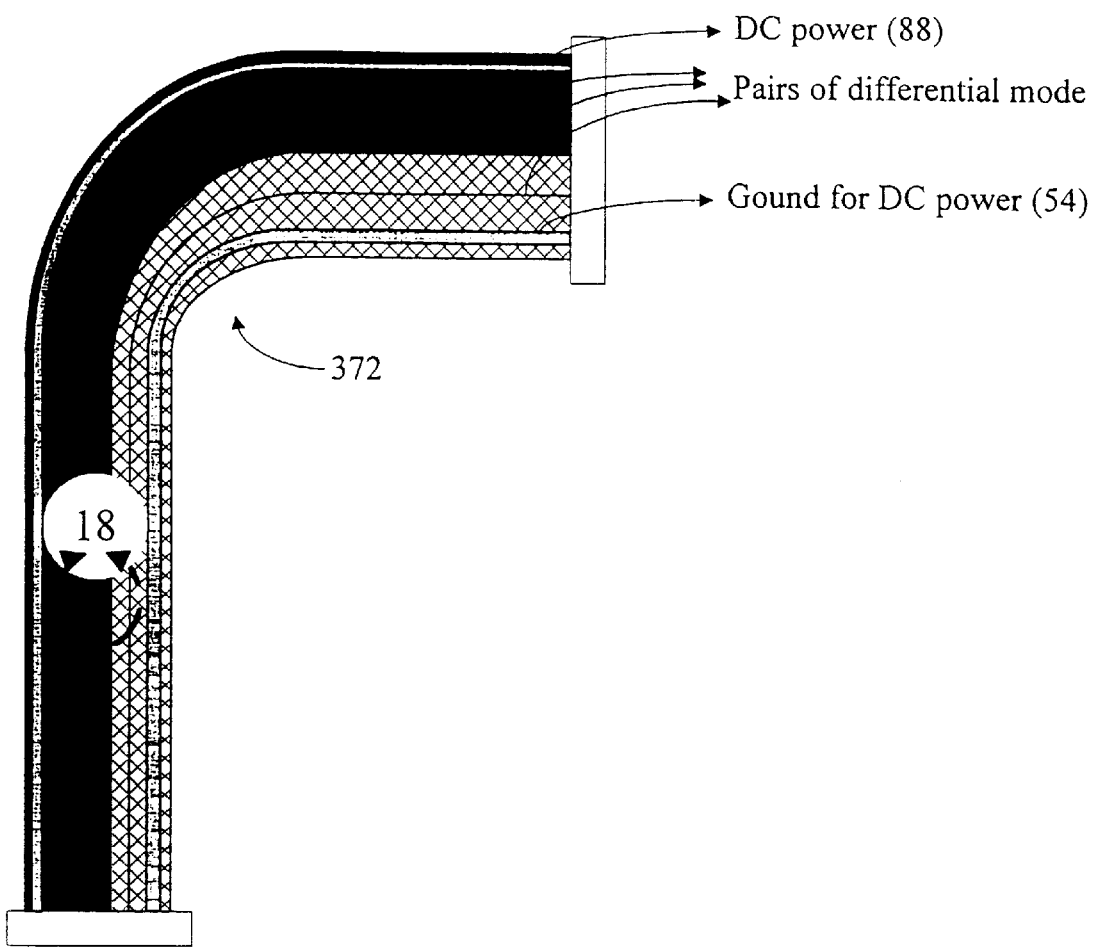
FIG. 17 depicts a plan view of a shielded circuit board as the fifth embodiment in accordance with the present invention.

The location configurations related to void opening patterns are the following: the first one is related to curves of the signal lines, and the second one is not related to curves of the signal lines. Cables 30, 130, 372 as shown in FIGS. 1, 6, 17, respectively, are belonging to the first one, and cables 210, 310 as shown in FIGS. 9 and 14, respectively, are belonging to the second one.

FIG. 3 depicts a cross-sectional elevational view of the present invention taken along the lines 3—3 in FIG. 2. There are solder masker layers on both sides to protect the conductive element, and the structure is summarized as the following description. The first layer is a very thin solder masker. The second layer is a shielding plane 28 with a conductive element, which is defined as the first plane with the first predetermined shielding configuration. The third layer is PI (Polyamide), PET or equivalent flexible material.

The fourth layer is an adhesive layer. The fifth layer is a signal conductor (copper) layer. The sixth, the seventh, the eighth and the ninth layers are as the same as the fourth, the third, the second, and the first layers, respectively. The eighth layer is a shielding plane 40 with a conductive element, which is defined as the second plane with the second predetermined shielding configuration. The third and fourth layers can be combined by using a special adhesive type flexible material to reduce the thickness, and so do the sixth and seventh layers.

Flexible cable with 6 mil has been produced in accordance with the present invention.

Figure 4:
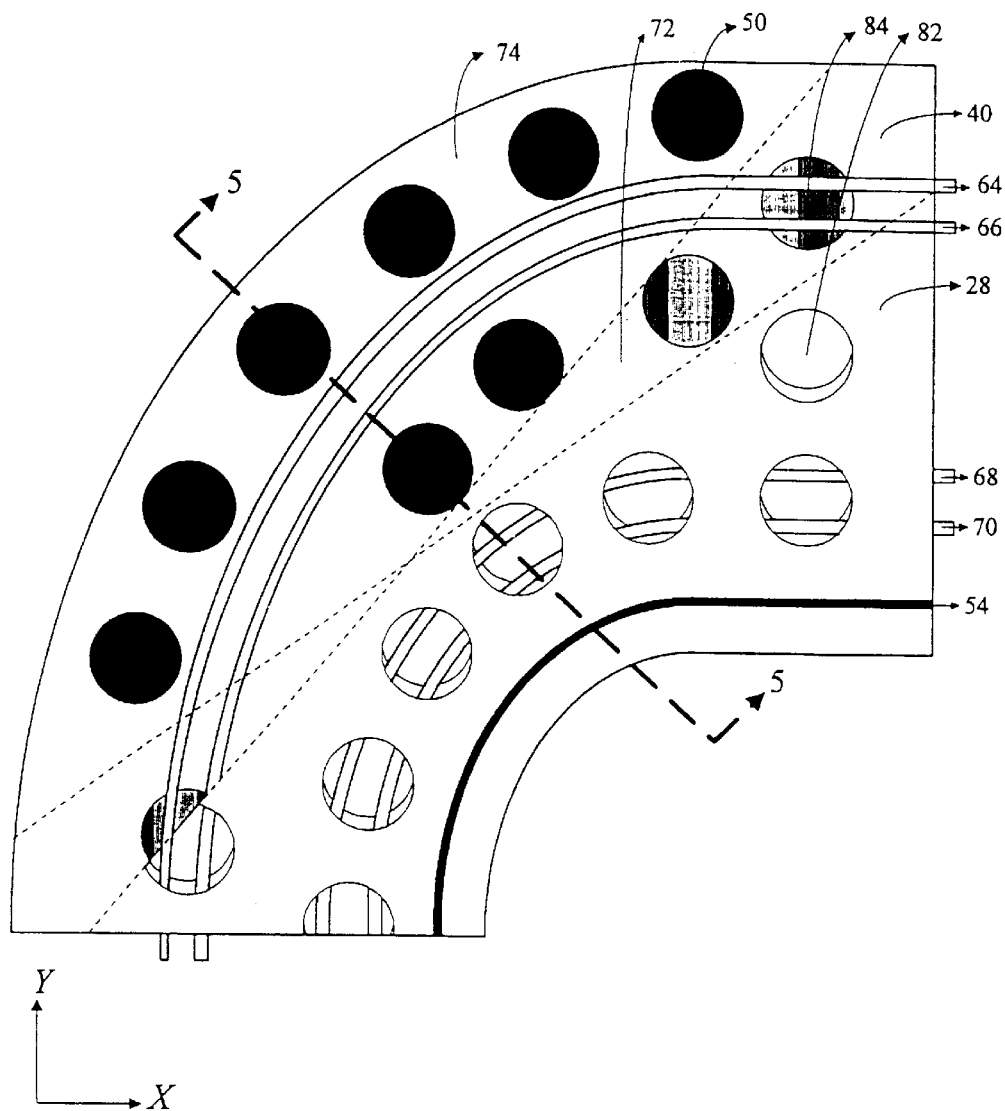
FIG. 4 depicts an enlarged plan view of a section denoted by 4 in FIG. 1 showing a method of making a 90-degree turn in a signal conductor.
Figure 5:
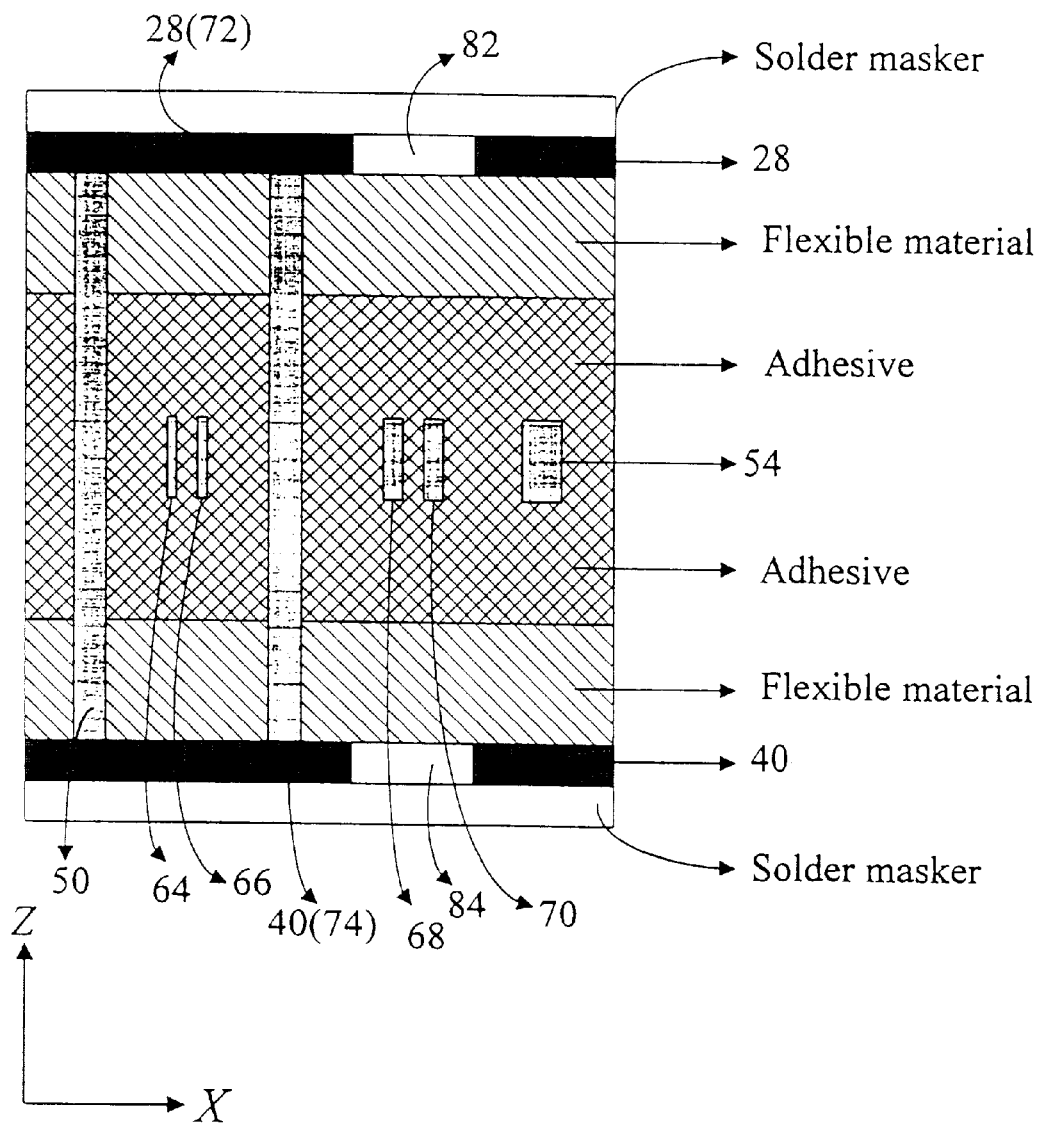
FIG. 5 depicts a cross-sectional elevational view of the present invention taken along the line 5—5 in FIG. 4.

FIG. 4 depicts an enlarged plan view of a section denoted by 4 in FIG. 1 showing a method of making a 90-degree turn in a signal conductor. Solid patterns 72, 74 are located at the turn of the cable 30, and solid pattern 72 is located at the upper plane and solid pattern 74 is located at the bottom plane, as shown in FIGS. 4 and 5. There are vias 50 located at the turn of the cable 30 between two pairs of signal conductors 64, 66 and 68, 70 to block the crosstalk due to discontinuity at the turn. These vias are not necessary for large spacing between pair of signal conductors 64, 66 and pair of signal conductors 68, 70 because large spacing between these two pairs 64, 66 and 68, 70 may not have significant crosstalk. If the accuracy of impedance is required in the above solid pattern area, then different and compatible widths of the signal lines for varied length of the transmission lines are needed to have the same impedance. Therefore, the longer the length of the transmission lines 64, 66, the less the width of the signal lines 64, 66 is needed to have the same impedance. It implies that, during the sections 72, 74, the width of signal conductor pair 64, 66 is less than that of signal conductor pair 68, 70 as shown in FIG. 5.

Figure 7:
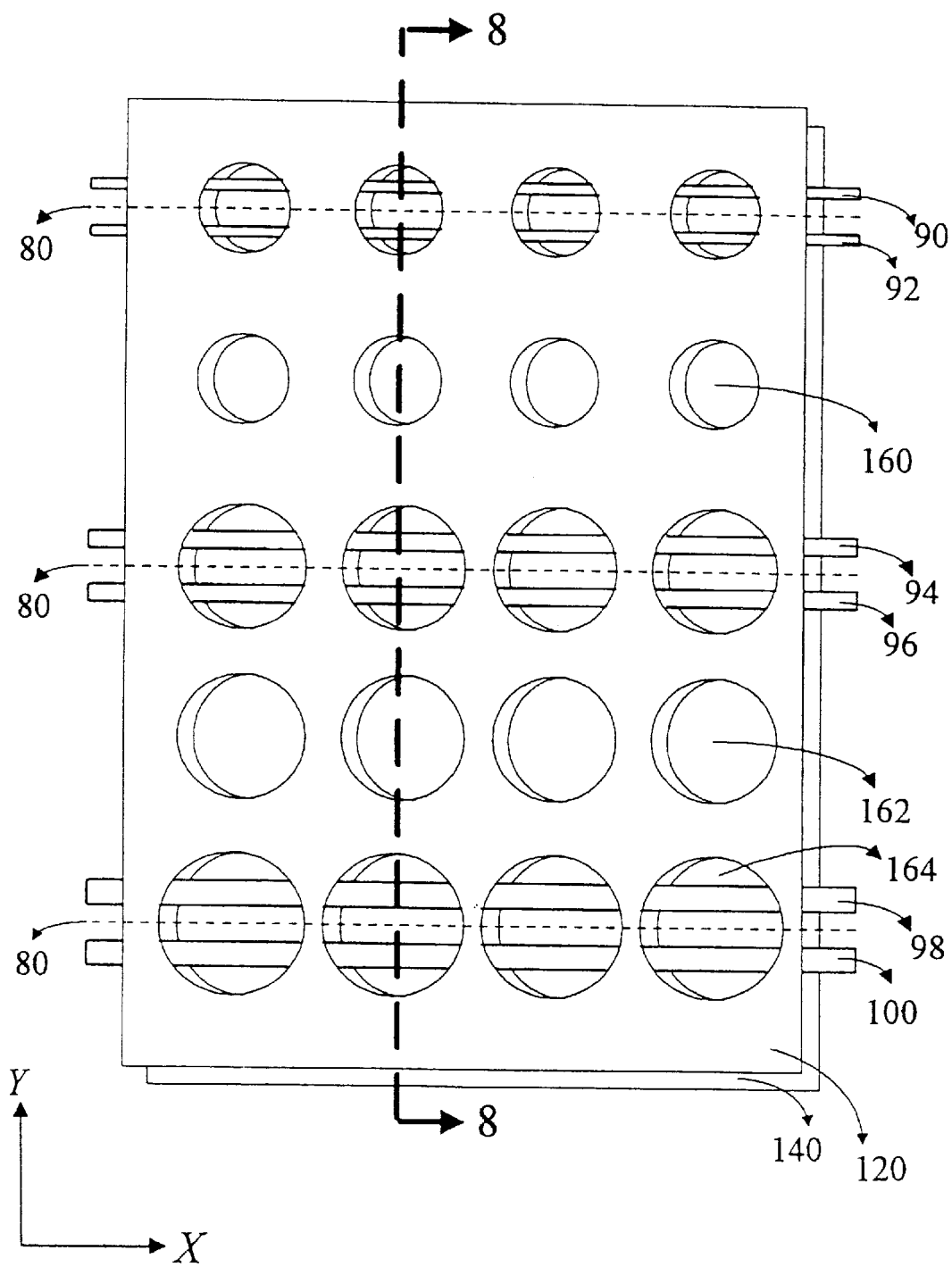
FIG. 7 depicts an enlarged view of a section denoted by 7 in FIG. 6.

With reference to FIG. 6, a plane view of a shielded flexible circuit board 130 as the second embodiment in accordance with the present invention is illustrated. The first and the second varied void opening patterns are circles 160, 162, 164 with varied diameters as shown in FIGS. 6 and 7. The location configurations of the varied opening circles 160, 162, 164 are related to the orientation curves of the signal conductors 90, 92, 94, 96, 98, 100 as shown in FIGS. 6 and 7.

Varied void opening patterns 160, 162, 164 induce slow wave effects to compensate for timing effect with less undesired electromagnetic radiation as compared with the addition of the extra equivalent lengths. The easiest preferable way to implement the varied void opening patterns 160, 162, 164 is to design them with compatible percentage of void open areas for varied length of transmitted lines 90, 92, 94, 96, 98, 100. As shown in FIGS. 6 and 7, the longer the length of the transmission lines 90, 92 is, the less the percentage of void area of pattern 160 is. That is, the less the percentage of void area of pattern 160, the less the transmitted time of the signal conductors 90, 92 is. If the accuracy of impedance is also required in the above varied void opening area, then different and compatible widths of the signal lines for varied length of the transmission lines are needed to have the same impedance. Therefore, the longer the length of the transmission lines 90, 92 with smaller percentage of void area pattern 160 is, the less the width of the signal lines 90, 92 is needed to have the same impedance. It implies the width of signal conductor 90 is less than that of signal conductor 94 as shown in FIG. 7.

Figure 8:
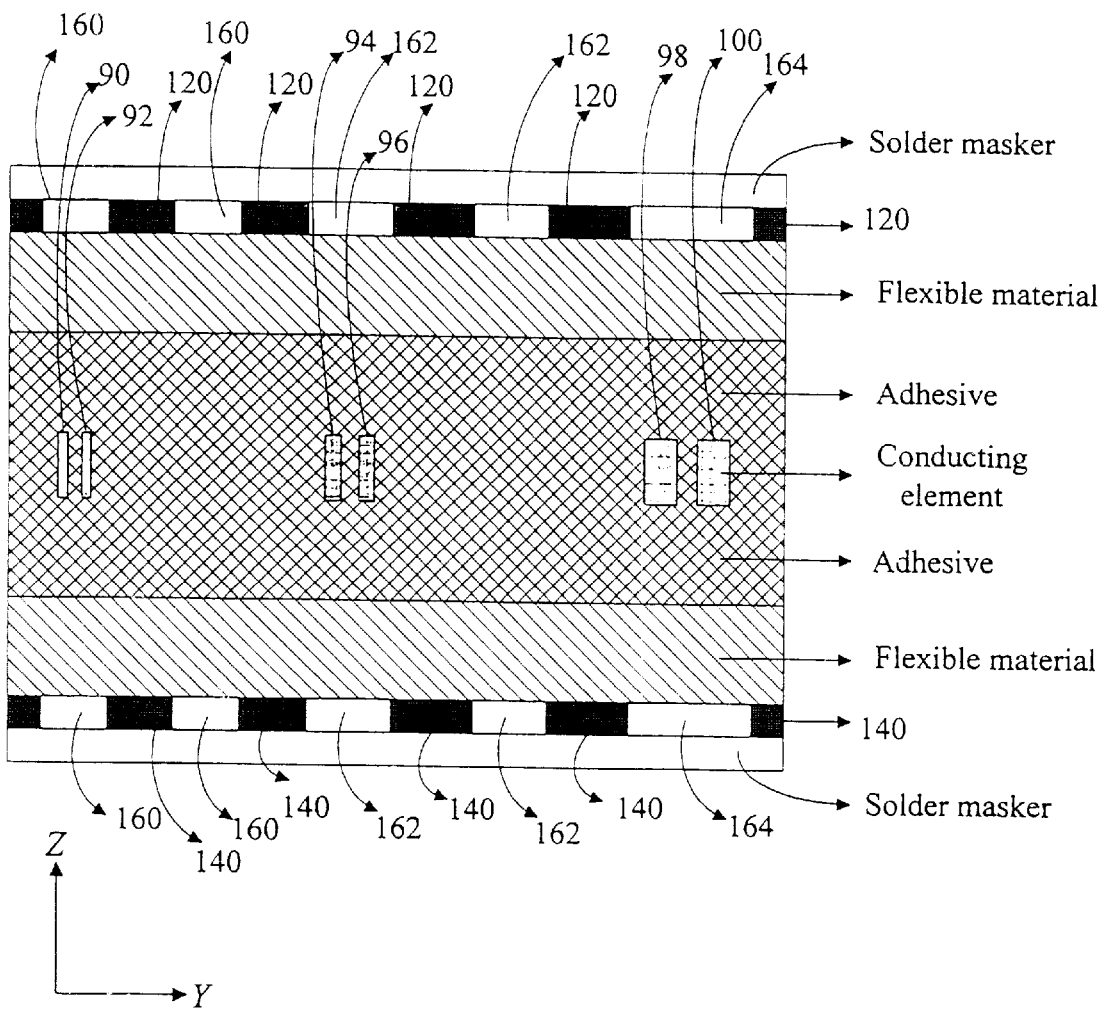
FIG. 8 depicts a cross-sectional elevational view of the present invention taken along the line 8—8 in FIG. 7.

FIG. 8 depicts a cross-sectional elevational view of the present invention taken along the line 8—8 in FIG. 7.

Figure 10:
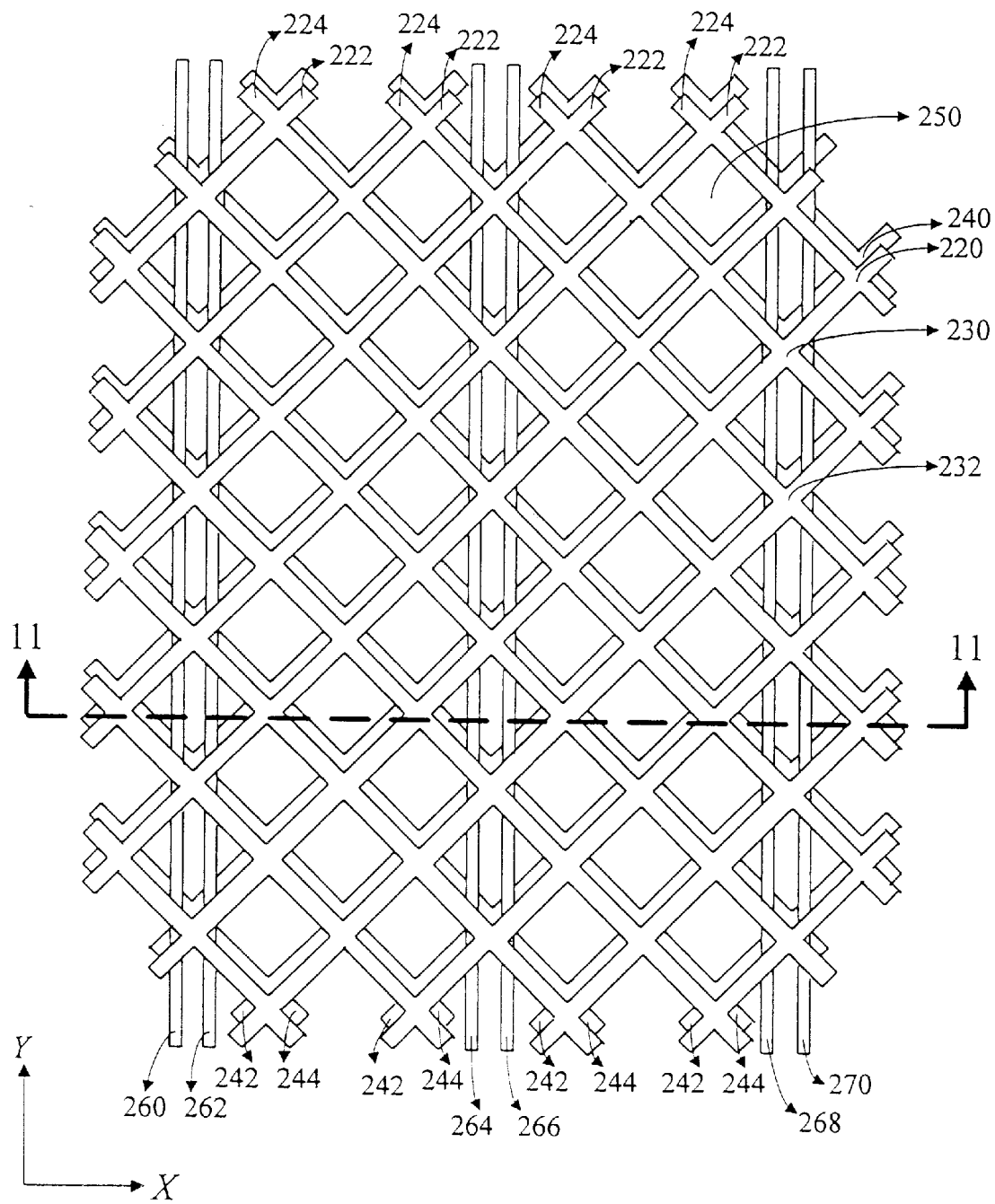
FIG. 10 depicts an enlarged view of a section denoted by 10 in FIG. 9.
Figure 11:
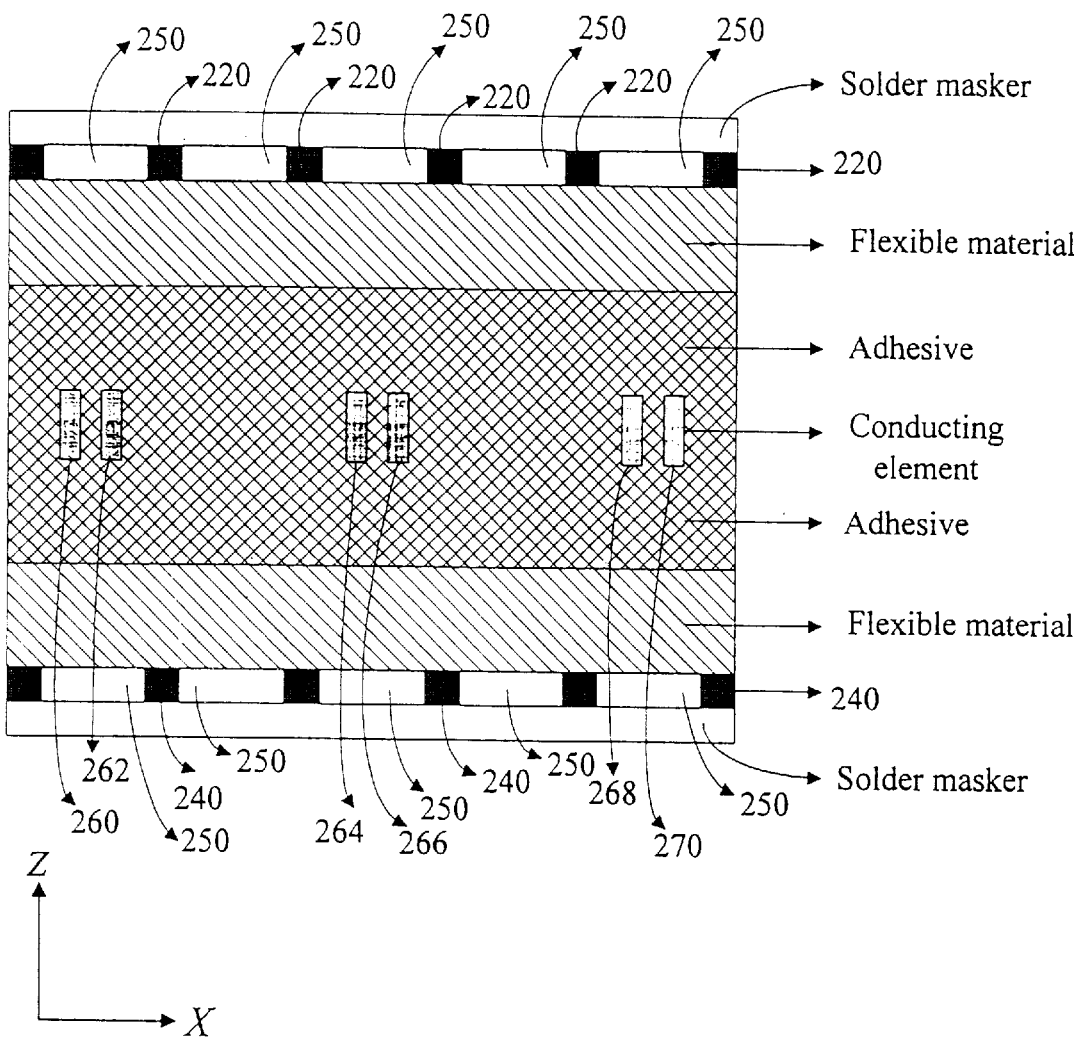
FIG. 11 depicts a cross-sectional elevational view of the present invention taken along the line 11—11 in FIG. 10

With reference to FIG. 9, a plan view of a shielded flexible circuit board as the third embodiment 210 in accordance with the present invention is illustrated. The circuit board 210 with a turn has effect of varied transmission timing, and the circuit board 30 with compatible length (around 32 cm) has effect with the second mode of harmonics (910 MHz) of the transmission frequency 455 MHz. The circuit board 210 has a combination of a square void opening square pattern 250 and a predetermined small portion of solid patterns 274, 272 located at the turn of the circuit board 210, as shown in a section denoted by 12 of FIG. 9. The location configurations of the void opening square pattern 250 are the same and not related to the orientation curves of the signal conductors 260, 262, 264, 266, 268, 270, as shown in FIGS. 9 and 10. FIG. 10 depicts an enlarged view of a section denoted by 10 in FIG. 9, and FIG. 11 depicts a cross-sectional elevational view of the present invention taken along the line 11—11 in FIG. 10.

Figure 12:
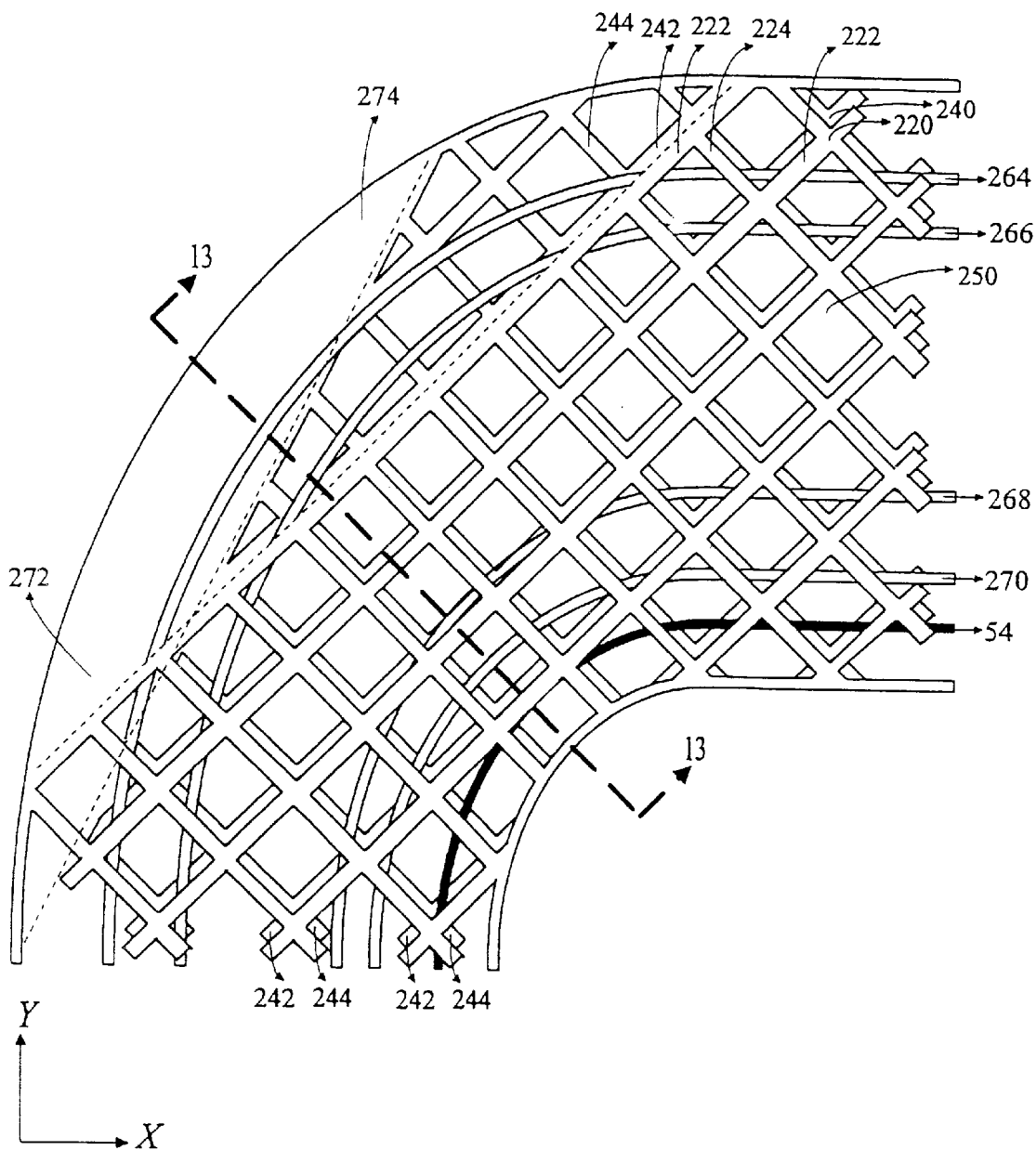
FIG. 12 depicts an enlarged view of a section denoted by 12 in FIG. 9.
Figure 13:
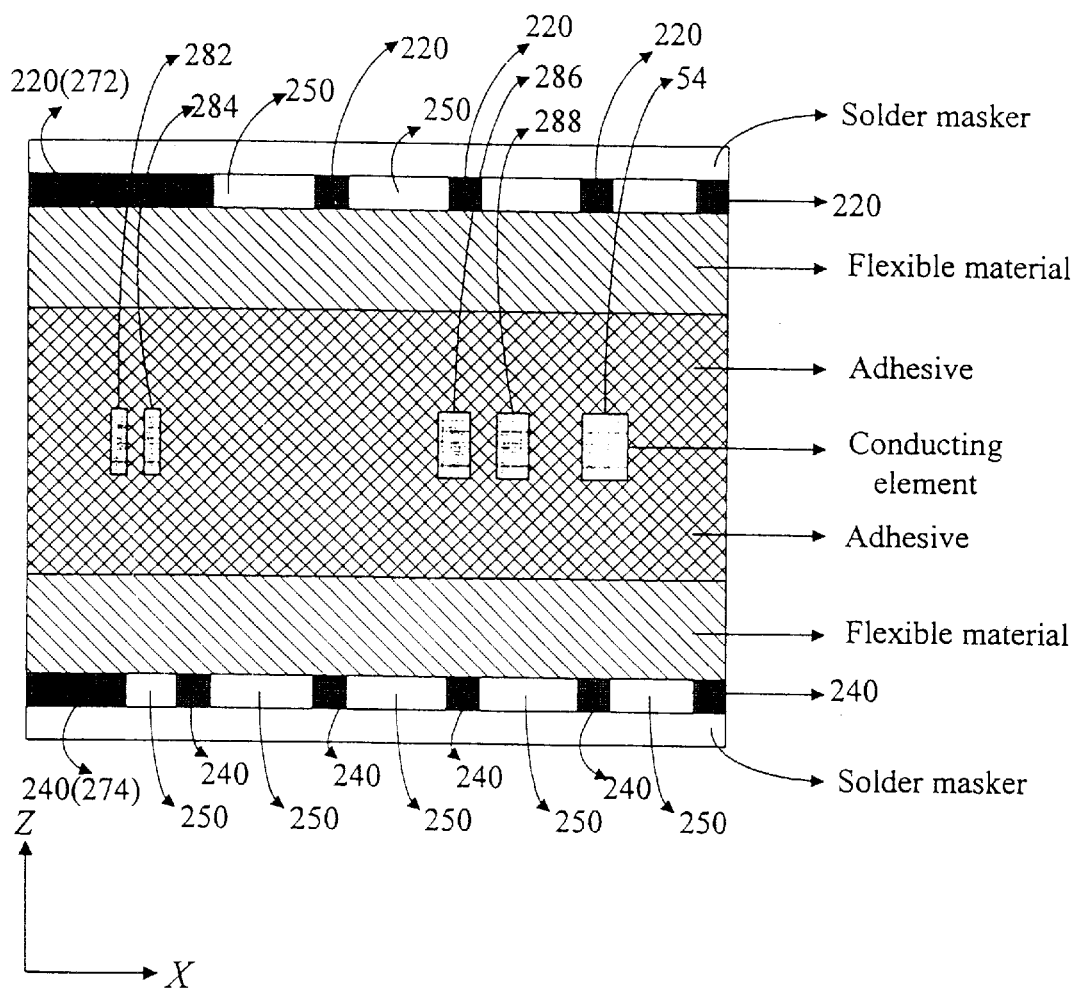
FIG. 13 depicts a cross-sectional elevational view of the present invention taken along the line 13—13 in FIG. 12.

FIG. 12 depicts an enlarged view of a section denoted by 12 in FIG. 9 with the solid pattern 272 absent. FIG. 13 depicts a cross-sectional elevational view of the present invention taken along the line 13—13 in FIG. 12. If the accuracy of impedance is needed, then the width of signal conductors 264, 266 gradually becomes small for matching the requirements of impedance because of increasing of capacitance by solid patterns 272, 274. That is, the width of signal conductors 264, 266 within the area of solid patterns 272, 274 is less than that of signal conductors 268, 270, as shown in FIGS. 12 and 13.

Figure 15:
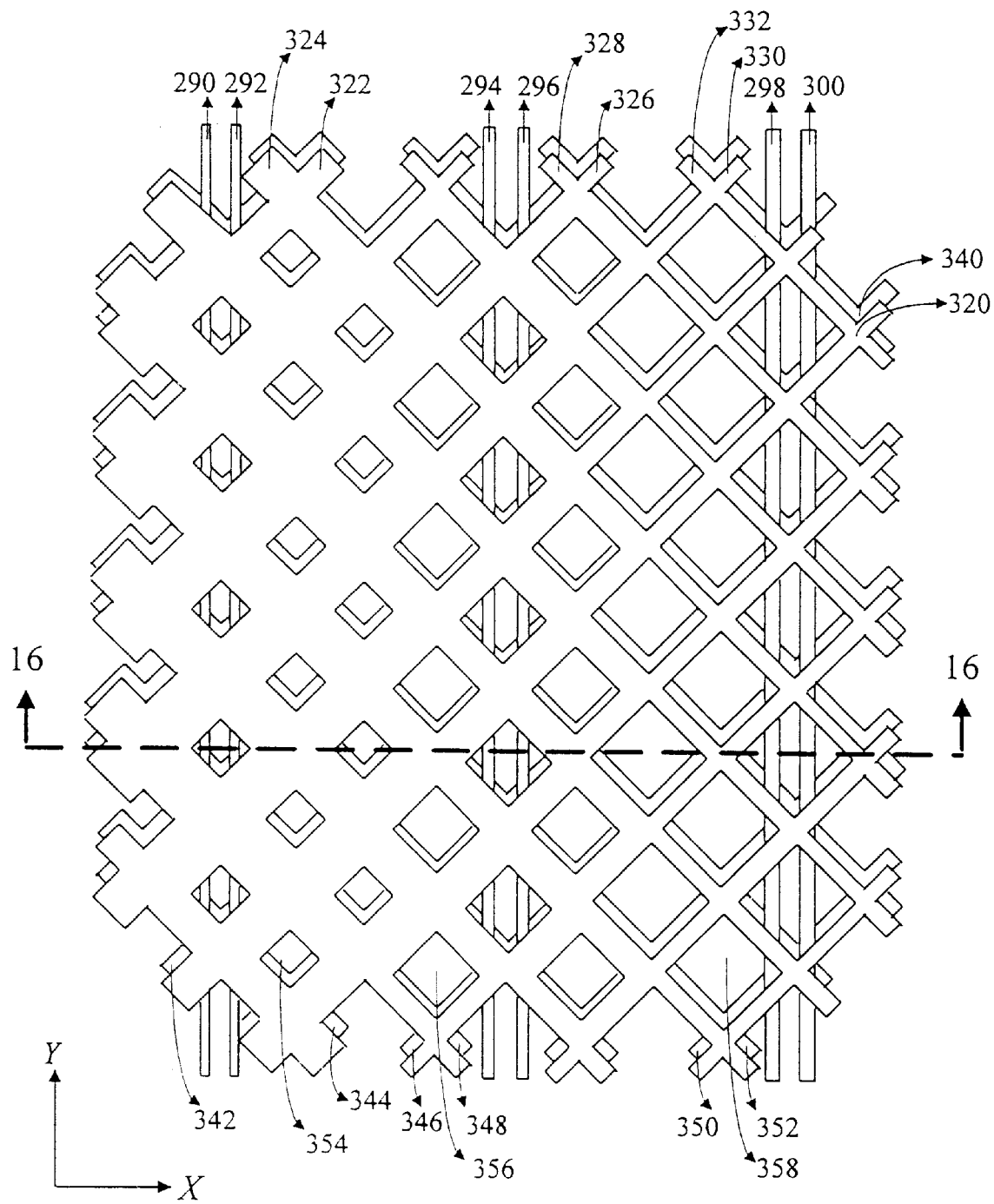
FIG. 15 depicts an enlarged view of a section denoted by 15 in FIG. 14.
Figure 16:
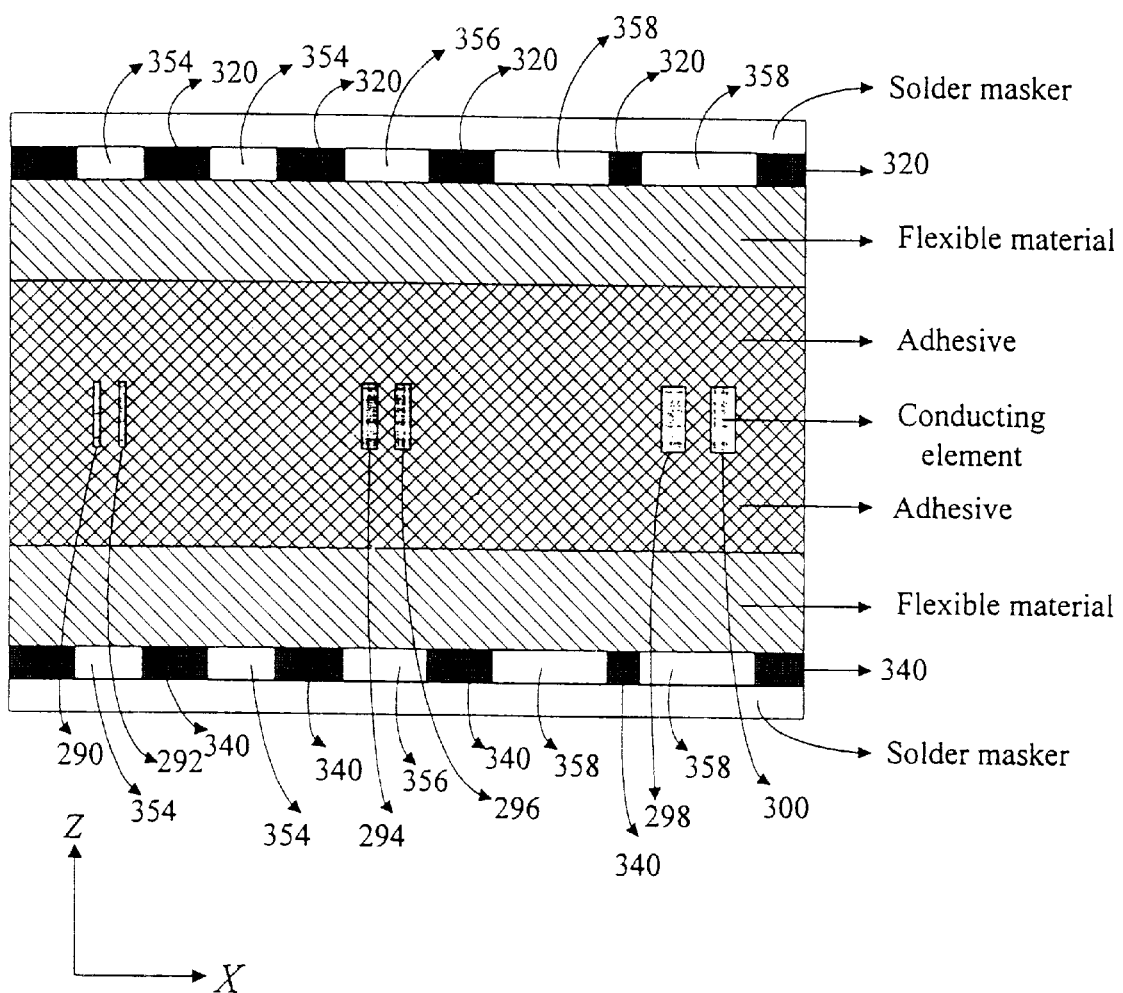
FIG. 16 depicts a cross-sectional elevational view of the present invention taken along the line 16—16 in FIG. 15.

With reference to FIG. 14, a plan view of a shielded flexible circuit board as the fourth embodiment in accordance with the present invention is illustrated. The circuit board 310 has varied square void openings with location configuration which is unrelated to the curve of the circuit board 310. FIG. 15 depicts an enlarged view of a section denoted by 15 in FIG. 14. FIG. 16 depicts a cross-sectional elevational view of the present invention taken along the line 16—16 in FIG. 15. It should be noted that void opening square patterns 354, 356, 358 have varied opening squares. Varied void opening square patterns 354, 356, 358 induce slow wave effects to compensate for timing effect with less undesired electromagnetic radiation as compared with the addition of the extra equivalent lengths. The easiest preferable way to implement the varied void opening patterns 354, 356, 358 is to design them with compatible percentage of void open areas for varied length of transmitted lines 290, 292, 294, 296, 298, 300. As shown in FIGS. 14 and 15, the longer the length of the transmission lines 290–292 is, the less the percentage of void opening square pattern 354 is. That is, the less the percentage of void area of square pattern 354, the less transmitted time of the signal conductors 290–292 is. If the accuracy of impedance is also required in the above varied void opening area, then different and compatible widths of the signal lines for varied length of the transmission lines are needed to have the same impedance. Therefore, the longer the length of the transmission lines 290, 292 with smaller percentage of void area square pattern 354 is, the less the width of the signal lines 290, 292 is needed to have the same impedance. It implies the width of signal conductors 290, 292 is less than that of signal conductors 294, 296 as shown in FIGS. 15, 16.

Figure 18:
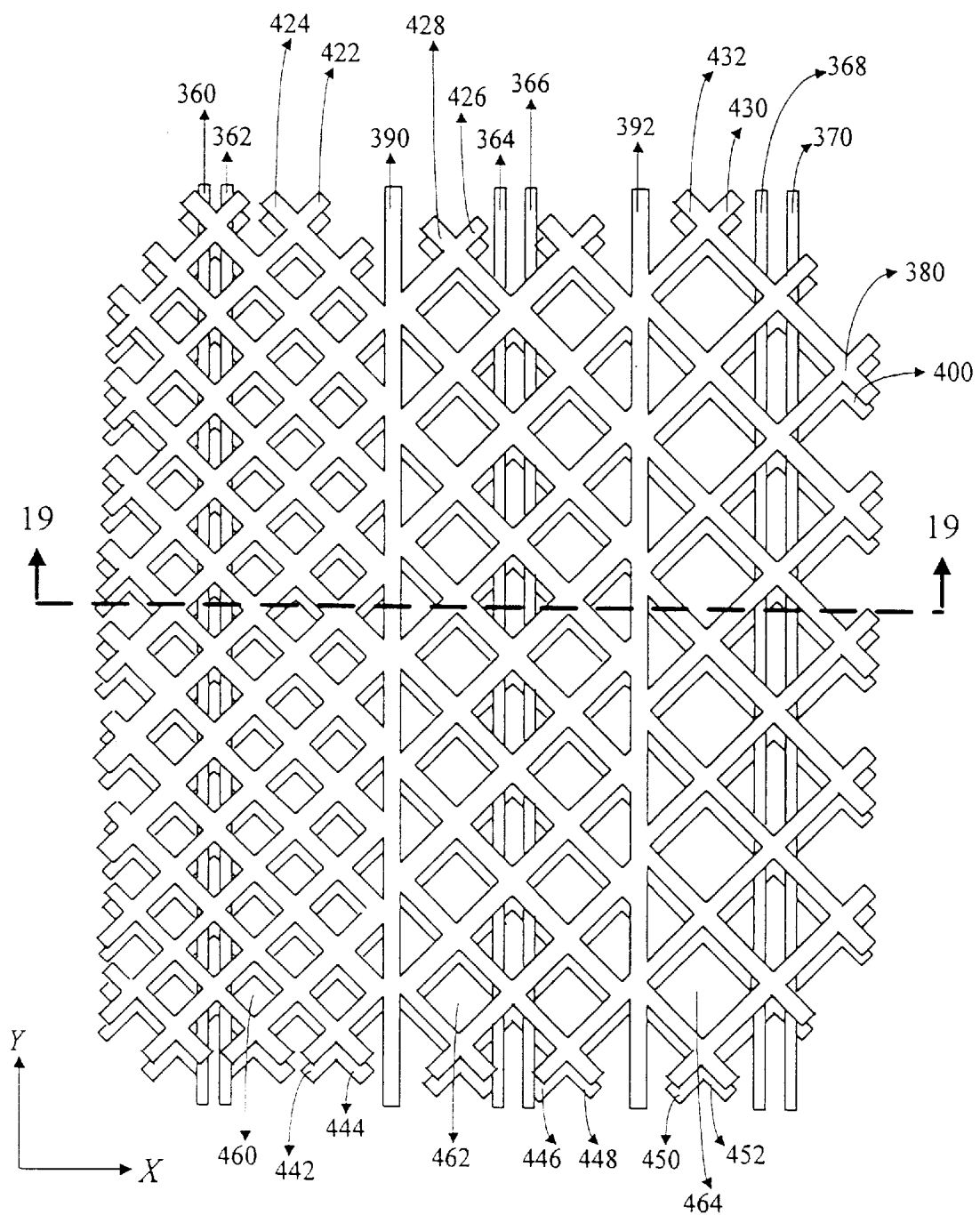
FIG. 18 depicts an enlarged view of a section denoted by 18 in FIG. 17.
Figure 19:
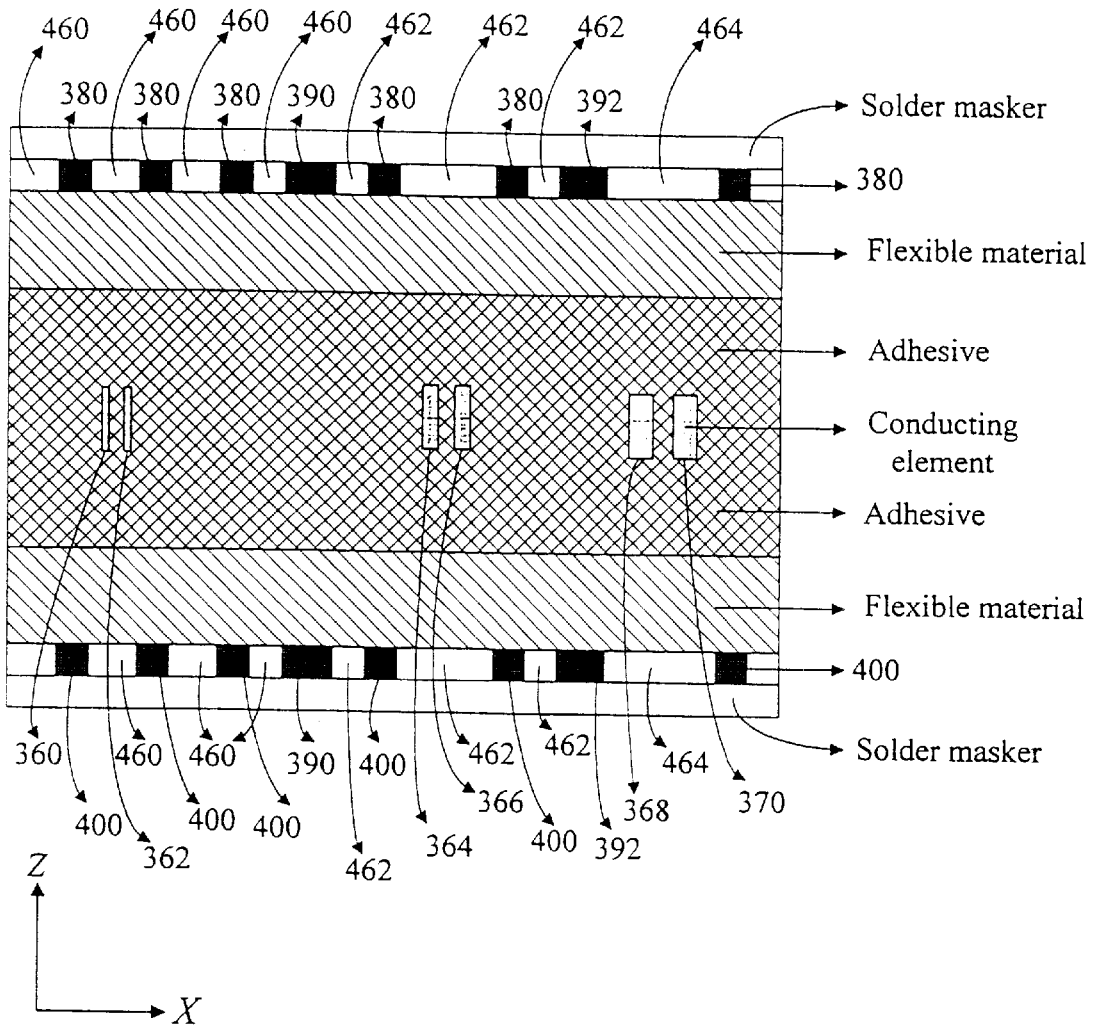
FIG. 19 depicts a cross-sectional elevational view of the present invention taken along the line 19—19 in FIG. 18.

FIG. 17 depicts a plan view of a shielded flexible circuit board 372 as the fifth embodiment in accordance with the present invention, wherein the circuit board 372 has varied square void openings with location configuration which is related to the curve of the circuit board 372. FIG. 18 depicts an enlarged view of a section denoted by 18 in FIG. 17. FIG. 19 depicts a cross-sectional elevational view of the present invention taken along the line 19—19 in FIG. 18. It should be noted that void opening square patterns 460, 462, 464 have varied opening squares. Varied void opening square patterns 460, 462, 464 induce slow wave effects to compensate for timing effect with less undesired electromagnetic radiation as compared with the addition of the extra equivalent lengths. These lines 390, 392, as shown in FIG. 18, are needed to connect different sizes of void opening square patterns 460, 462, 464 for better shielding effect. The easiest preferable way to implement the varied void opening patterns 460, 462, 464 is to design them with compatible percentage of void open areas for varied length of transmitted lines 360, 362, 364, 366, 368, 370. As shown in FIGS. 17 and 18, the longer the length of the transmission lines 360, 362 is, the less the percentage of void opening square pattern 460 is. That is, the less the percentage of void area of square pattern 460 and the less the transmitted time of the signal conductors 360, 362 is. If the accuracy of impedance is also required in the above varied void opening area, then different and compatible widths of the signal lines for varied length of the transmission lines are needed to have the same impedance. Therefore, the longer the length of the transmission lines 360, 362 with smaller percentage of void area square pattern 460 is, the less the width of the signal lines 360, 362 is needed to have the same impedance. It implies the width of signal conductors 360, 362 is less than that of signal conductors 364, 366 as shown in FIGS. 18, 19.

Although only the preferred embodiments of this invention were shown and described in the above description, it is requested that any modification or combination that comes within the spirit of this invention be protected.

What is claimed is:

1. A circuit board comprising:
   a first predetermined shielding configuration, defined in a first plane, comprising a first set of predetermined varied void opening patterns with a first predetermined location configuration which comprises locations of said first set of predetermined varied void opening patterns;
   a second predetermined shielding configuration, defined in a second plane, comprising a second set of predetermined varied void opening patterns with a second predetermined location configuration which comprises locations of said second set of predetermined varied void opening patterns; and
   signal conducting elements being disposed between said first and second planes and having a virtual ground of differential mode pair of said signal conducting elements defined as the middle of said differential mode pair of said signal conducting elements;
   wherein said signal conducting elements or said virtual ground is positioned at a predetermined location with respect to said first and second predetermined shielding configurations.

2. The circuit board of claim 1, wherein said first and second sets of predetermined varied void opening patterns comprise varied void openings and a largest dimension of said varied void openings is less than one-twentieth of a wavelength of a highest frequency of a signal conducted by said signal conducting elements.

3. The circuit board of claim 1, wherein said first and second predetermined shielding configurations comprise conductive elements with said predetermined varied void opening patterns.

4. The circuit board of claim 3, wherein a combination of said first and second sets of predetermined varied void opening patterns, and a spacing of said conductive elements with respect to said signal conducting elements is designed to match requirements of impedance, transmitted timing and electromagnetic radiation control for said signal conducting elements.

5. The circuit board of claim 3, wherein said conductive elements of said first and second predetermined shielding configurations are thin film type conductive elements.

6. The circuit board of claim 1, wherein said first and second predetermined location configurations comprise grids.

7. The circuit board of claim 1, wherein said first and second predetermined location configurations are aligned with respect to orientation curves of said signal conducting elements or said virtual ground of differential mode pair of said signal conducting elements.

8. The circuit board of claim 1, wherein each void opening pattern of said first and second sets of predetermined varied void opening patterns comprises a void opening pattern selected from the group of circle, ellipse, square, and rhombus patterns.

9. The circuit board of claim 1, wherein said first and second sets of predetermined varied void opening patterns comprise varied symmetric void opening patterns.

10. The circuit board of claim 9, wherein said predetermined location of said signal conducting elements or said virtual ground with respect to said first and second predetermined shielding configurations is determined by centers of said symmetric void opening patterns.

11. The circuit board of claim 1, wherein said first and second predetermined shielding configurations and said signal conducting elements comprise a flexible cable.

12. The circuit board of claim 1, wherein said first and second planes are connected and designated as only ground for said differential mode of pair of said signal conducting elements, and a power, a ground for power, or common mode signals are conducted by said signal conducting elements.

13. The circuit board of claim 1, wherein said second predetermined location configuration is identical to said first predetermined location configuration.

14. The circuit board of claim 13, wherein said first and second predetermined location configurations comprise grids.

15. The circuit board of claim 1, wherein said first predetermined shielding configuration comprises varied circle void opening patterns with a predetermined grid type location configuration, and said second predetermined shielding configuration is identical to said first predetermined shielding configuration.

16. The circuit board of claim 15, wherein said varied circle void opening patterns comprise varied circle void openings and a largest dimension of said varied circle void openings is less than one-twentieth of a wavelength of a highest frequency of a signal conducted by said signal conducting elements.

17. The circuit board of claim 15, wherein said first and second predetermined shielding configurations and said signal conducting elements comprise a flexible cable.

18. The circuit board of claim 15, wherein said first and second planes are connected and designated as only ground for said differential mode of pair of said signal conducting elements, and a power, a ground for power, or common mode signals are conducted by said signal conducting elements.

19. The circuit board of claim 15, wherein said first and second predetermined shielding configurations comprise thin film type conductive elements with said varied circle void opening patterns.

20. The circuit board of claim 1, wherein said first predetermined shielding configuration comprises varied ellipse void opening patterns with a predetermined grid type location configuration, and said second predetermined shielding configuration is identical to said first predetermined shielding configuration.

21. The circuit board of claim 20, wherein said varied ellipse void opening patterns comprise varied ellipse void openings and a largest dimension of said varied ellipse void openings is less than one-twentieth of a wavelength of a highest frequency of a signal conducted by said signal conducting elements.

22. The circuit board of claim 20, wherein said first and second predetermined shielding configurations and said signal conducting elements comprise a flexible cable.

23. The circuit board of claim 20, wherein said first and second planes are connected and designated as only ground for said differential mode of pair of said signal conducting elements, and a power, a ground for power, or common mode signals are conducted by said signal conducting elements.

24. The circuit board of claim 20, wherein said first and second predetermined shielding configurations comprise thin film type conductive elements with said varied ellipse void opening patterns.

25. The circuit board of claim 1, wherein said first predetermined shielding configuration comprises varied rhombus void opening patterns with a predetermined grid type location configuration, and said second predetermined shielding configuration is identical to said first predetermined shielding configuration.

26. The circuit board of claim 25, wherein said varied rhombus void opening patterns comprise varied rhombus void openings and a largest dimension of said varied rhombus void openings is less than one-twentieth of a wavelength of a highest frequency of a signal conducted by said signal conducting elements.

27. The circuit board of claim 25, wherein said first and second predetermined shielding configurations and said signal conducting elements comprise a flexible cable.

28. The circuit board of claim 25, wherein said first and second planes are connected and designated as only ground for said differential mode of pair of said signal conducting elements, and a power, a ground for power, or common mode signals are conducted by said signal conducting elements.

29. The circuit board of claim 25, wherein said first and second predetermined shielding configurations comprise thin film type conductive elements with said varied rhombus void opening patterns.

30. The circuit board of claim 1, wherein said first predetermined shielding configuration comprises varied square void opening patterns with a predetermined grid type location configuration, and said second predetermined shielding configuration is identical to said first predetermined shielding configuration.

31. The circuit board of claim 30, wherein said varied square void opening patterns comprise varied square void openings and a largest dimension of said varied square void openings is less than one-twentieth of a wavelength of a highest frequency of a signal conducted by said signal conducting elements.

32. The circuit board of claim 30, wherein said first and second predetermined shielding configurations and said signal conducting elements comprise a flexible cable.

33. The circuit board of claim 30, wherein said first and second planes are connected and designated as only ground for said differential mode of pair of said signal conducting elements, and a power, a ground for power, or common mode signals are conducted by said signal conducting elements.

34. The circuit board of claim 30, wherein said first and second predetermined shielding configurations comprise thin film type conductive elements with said varied square void opening patterns.

35. A circuit board comprising:
    a first predetermined shielding configuration, defined in a first plane, comprising a first set of predetermined varied void opening patterns with a first predetermined location configuration which comprises locations of said first set of predetermined varied void opening patterns; and
    signal conducting elements being disposed in a plane parallel to said first plane and having a virtual ground of differential mode pair of said signal conducting elements defined as the middle of said differential mode pair of said signal conducting elements;
    wherein said signal conducting elements or said virtual ground is positioned at a predetermined location with respect to said first predetermined shielding configuration.

36. The circuit board of claim 35, wherein said first set of predetermined varied void opening patterns comprises varied void openings and a largest dimension of said varied void openings is less than one-twentieth of a wavelength of a highest frequency of a signal conducted by said signal conducting elements.

37. The circuit board of claim 35, wherein said first predetermined shielding configuration comprises a conductive element with said first set of predetermined varied void opening patterns.

38. The circuit board of claim 37, wherein a combination of said first set of predetermined varied void opening patterns, and a spacing of said conductive element with respect to said signal conducting elements is designed to match requirements of impedance, transmitted timing and electromagnetic radiation control for said signal conducting elements.

39. The circuit board of claim 37, wherein said conductive element of said first predetermined shielding configuration is a thin film type conductive element.

40. The circuit board of claim 35, wherein said first predetermined location configuration comprises grids.

41. The circuit board of claim 35, wherein said first predetermined location configuration is aligned with respect to orientation curves of said signal conducting elements or said virtual ground of differential mode pair of said signal conducting elements.

42. The circuit board of claim 35, wherein each void opening pattern of said first set of predetermined varied void opening patterns comprises a void opening pattern selected from the group of circle, ellipse, square, and rhombus patterns.

43. The circuit board of claim 35, wherein said first set of predetermined varied void opening patterns comprises varied symmetric void opening patterns.

44. The circuit board of claim 43, wherein said predetermined location of said signal conducting elements or said virtual ground with respect to said first predetermined shielding configuration is determined by centers of said symmetric void opening patterns.

45. The circuit board of claim 35, further comprising a second predetermined shielding configuration, defined in a second plane, comprising a combination of a second set of predetermined void opening patterns with a second predetermined location configuration which comprises locations of said second set of predetermined void opening patterns, and a second set of predetermined solid patterns positioned at predetermined locations.

46. The circuit board of claim 35, further comprising a second predetermined shielding configuration, defined in a second plane, comprising a second set of predetermined varied void opening patterns with a second predetermined location configuration which comprises locations of said second set of predetermined varied void opening patterns, said second set of predetermined varied void opening patterns being divided into a plurality of groups connected by conductive lines, each group comprising a plurality of identical void openings.

* * * * *